(12) United States Patent
Liu et al.

(10) Patent No.: US 10,707,431 B2
(45) Date of Patent: Jul. 7, 2020

(54) STRETCHABLE DISPLAY PANELS AND MANUFACTURING METHODS THEREOF

(71) Applicants: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

(72) Inventors: Huimin Liu, Kunshan (CN); Rubo Xing, Kunshan (CN); Dong Wei, Kunshan (CN); Jiantai Wang, Kunshan (CN)

(*) Notice: Subject to any disclaimer, the term of this patent is extended or adjusted under 35 U.S.C. 154(b) by 0 days.

(21) Appl. No.: 16/503,497

(22) Filed: Jul. 4, 2019

(65) Prior Publication Data

US 2019/0326532 A1 Oct. 24, 2019

Related U.S. Application Data

(63) Continuation of application No. PCT/CN2018/091861, filed on Jun. 19, 2018.

(30) Foreign Application Priority Data

Mar. 7, 2018 (CN) .......................... 2018 1 0186942

(51) Int. Cl.
*H01L 51/00* (2006.01)
*H01L 25/075* (2006.01)
(Continued)

(52) U.S. Cl.
CPC ........ *H01L 51/0097* (2013.01); *H01L 25/048* (2013.01); *H01L 25/0753* (2013.01);
(Continued)

(58) Field of Classification Search
CPC ............. H01L 51/0097; H01L 25/0753; H01L 25/048; H01L 33/54; H01L 33/62;
(Continued)

(56) References Cited

U.S. PATENT DOCUMENTS

2006/0204675 A1* 9/2006 Gao .................. G02F 1/133377
428/1.1
2007/0052636 A1* 3/2007 Kalt ......................... G09G 3/34
345/83
(Continued)

FOREIGN PATENT DOCUMENTS

CN 102496684 A 6/2012
CN 105895662 A 8/2016
(Continued)

*Primary Examiner* — Victor A Mandala
(74) *Attorney, Agent, or Firm* — Kilpatrick Townsend & Stockton

(57) ABSTRACT

The present disclosure discloses a stretchable display panel and a method of manufacturing the same. The stretchable display panel includes an elastic base layer and a number of array-distributed display units embedded in the elastic base layer. At least one of the display units include a pixel unit and a rigid protection body, and the rigid protection body includes at least a rigid sidewall disposed on at least one side of the pixel units.

20 Claims, 16 Drawing Sheets

(51) Int. Cl.
  *H01L 25/04* (2014.01)
  *H01L 33/54* (2010.01)
  *H01L 33/62* (2010.01)
  *H01L 51/52* (2006.01)
  *H01L 51/56* (2006.01)

(52) U.S. Cl.
  CPC .............. *H01L 33/54* (2013.01); *H01L 33/62* (2013.01); *H01L 51/52* (2013.01); *H01L 51/5253* (2013.01); *H01L 51/56* (2013.01); *H01L 2933/0033* (2013.01)

(58) Field of Classification Search
  CPC ..... H01L 51/52; H01L 51/56; H01L 51/5253; H01L 2933/0033; H01L 27/3276; H01L 2933/0066; H01L 27/156; H01L 27/3244; H01L 21/6835; H01L 2221/68386; H01L 51/003
  See application file for complete search history.

(56) References Cited

U.S. PATENT DOCUMENTS

| | | | | |
|---|---|---|---|---|
| 2012/0258573 A1* | 10/2012 | Yan | ...................... | H05K 3/0014 438/113 |
| 2014/0159046 A1* | 6/2014 | Deng | ...................... | H01L 51/52 257/72 |
| 2015/0108508 A1* | 4/2015 | Wu | ...................... | H01L 27/3283 257/84 |
| 2016/0240802 A1 | 8/2016 | Lee | | |
| 2017/0170360 A1* | 6/2017 | Bour | ...................... | H01L 33/305 |
| 2018/0294254 A1* | 10/2018 | Chen | ................... | G02B 19/0066 |

FOREIGN PATENT DOCUMENTS

| | | |
|---|---|---|
| CN | 107134536 A | 9/2017 |
| CN | 107204400 A | 9/2017 |
| WO | 2018214435 A1 | 11/2018 |

\* cited by examiner

STRETCHABLE DISPLAY PANELS AND MANUFACTURING METHODS THEREOF

CROSS-REFERENCES TO RELATED APPLICATIONS

This application is a continuation application of International Application No. PCT/CN2018/091861, filed on Jun. 19, 2018, which claims the priority to Chinese Patent Application No. 201810186942.1, entitled "STRETCHABLE DISPLAY PANELS AND MANUFACTURING METHODS THEREOF", and filed on Mar. 7, 2018. The entireties of both applications are incorporated by reference herein for all purposes.

BACKGROUND

The display panel is a commonly used product in people's daily life. Generally, the display panel is made of a rigid material such as glass and the like, and has a fixed size and a fragile structure.

SUMMARY

The technical problem to be solved by the present disclosure is to provide a stretchable display panel and a method of manufacturing the same, which can effectively protect a pixel unit and avoid damage of a pixel unit caused by stretching.

In order to solve the above technical problem, a technical solution adopted by the present disclosure is to provide a stretchable display panel including an elastic base layer and a plurality of array-distributed display units embedded in the elastic base layer, at least one of the display units include a pixel unit and a rigid protection body, and the rigid protection body includes at least a rigid sidewall disposed on at least one side of the pixel units.

In order to solve the above technical problem, another technical solution adopted by the present disclosure is to provide a method of manufacturing a stretchable display panel, including: forming a rigid substrate layer on a substrate; and etching the rigid substrate layer to form a rigid protection body including at least a rigid sidewall; forming a corresponding pixel unit on one side of the rigid sidewall such that the pixel unit and corresponding rigid protection body thereof constitute a display unit; forming the elastic base layer, the elastic base layer is filled at least between the adjacent display units.

The present disclosure has following beneficial effects: the present disclosure allows the display panel to be stretched or bent by embedding the display unit in the elastic base layer; further, by disposing a pixel unit and a rigid protection body in at least one of the display units. The rigid protection body includes at least a rigid sidewall disposed on at least one side of the pixel unit; and the rigid sidewall provides protection in a thickness dimension of the pixel unit, and is subjected to a tensile force or a bending tension in a thickness dimension, which avoids damage to the pixel unit when the stretchable display panel is stretched or bent.

DETAILED DESCRIPTION OF THE INVENTION

Stretchable display panels are desirable for various application. Unfortunately, a stretchable display panel cannot effectively protect a pixel unit, and the pixel unit is easily broken during the stretching process, which causes an inactive pixel unit and affects the normal display of the display panel.

The present disclosure will be described in detail below with reference to the accompanying drawings and embodiments.

Figure 1:
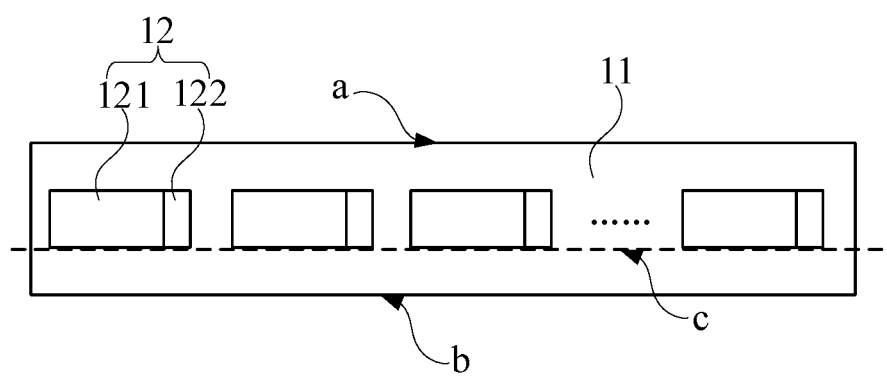
FIG. 1 is a cross-sectional structural diagram illustrating a stretchable display panel according to a first embodiment of the present disclosure.

Referring to FIG. 1, FIG. 1 is a cross-sectional structural diagram illustrating a stretchable display panel according to a first embodiment of the present disclosure. In the embodiment, the stretchable display panel may include an elastic base layer 11 and a plurality of display units 12.

A plurality of display units 12 are embedded in the elastic base layer 11, and the plurality of display units 12 are distributed in an array.

For example, the elastic base layer 11 has a first surface a and a second surface b, and the first surface a and the second surface b are parallel to each other. The plurality of display units 12 are distributed in a matrix on a reference plane c parallel to the first surface a and the second surface b of the elastic base layer 11. The reference plane c is located between the first surface a and the second surface b.

For example, the first surface a is the upper surface of the elastic base layer 11, and the second surface b is the lower surface of the elastic base layer 11.

Alternatively, each of the display units 12 includes a pixel unit 121 and a rigid sidewall 122 disposed at one side of the pixel unit 121. The rigid sidewalls 122 form a rigid protection body to protect the pixel unit. In other embodiments, it is possible that only some of the display units 12 are configured to include the pixel unit 121 and the rigid sidewall 122, and it is not necessary to include the pixel unit 121 and the rigid sidewall 122 in all of the display units of the stretchable display panel. This embodiment is not limited thereto.

Alternatively, the rigid sidewall 122 may have a material of PI (polyimide), PMMA (polymethyl methacrylate) or other patternable rigid materials.

The elastic base layer 11 may have a material of PDMS (polydimethylsiloxane), PU (polyurethane), TPE (thermoplastic elastomer) or other elastic or flexible materials.

In other embodiments, two corresponding rigid sidewalls may be respectively disposed at opposite sides of the pixel unit 121, three corresponding rigid sidewalls may be respectively disposed at three sides of the pixel unit 121, or four corresponding rigid sidewalls may be respectively disposed at four sides of the pixel unit 121.

Alternatively, in an embodiment in which rigid sidewalls are provided at all four sides of the pixel unit 121, the rigid sidewalls at the four sides may be connected to each other to form a rigid fence, as described in detail below.

Alternatively, the rigid sidewall 122 is perpendicular to the first surface a and the second surface b of the elastic base layer 11. In other embodiments, the angle between the rigid sidewall 122 and one of the first surface a and the second surface b ranges from 60 degree to 90 degree.

It should be understood that the stretchable display panel can be bent, stretched, etc., without being limited to stretching, and the rigid sidewall 122 being perpendicular to the surface of the elastic base layer 11 means the rigid sidewall 122 is perpendicular to the surface of the elastic base layer 11 in a natural state when the elastic base layer 11 is not deformed by external force.

In this embodiment, the pixel unit 121 may be a light emitting layer, and the light emitting layer may be an LED (Light Emitting Diode), an OLED (Organic Light-Emitting Diode), a Micro LED (Micro Light-Emitting Diode) or QLEDs (Quantum Dot Light Emitting Diodes) and the like.

In the present embodiment, the rigid sidewall 122 located on at least one side of the pixel unit 121 protects in the thickness dimension of the pixel unit 121 to withstand the tensile force or the bending tension in the thickness dimension, thereby avoiding damage to the pixel unit when the stretchable display panel is stretched or bent.

Figure 2:
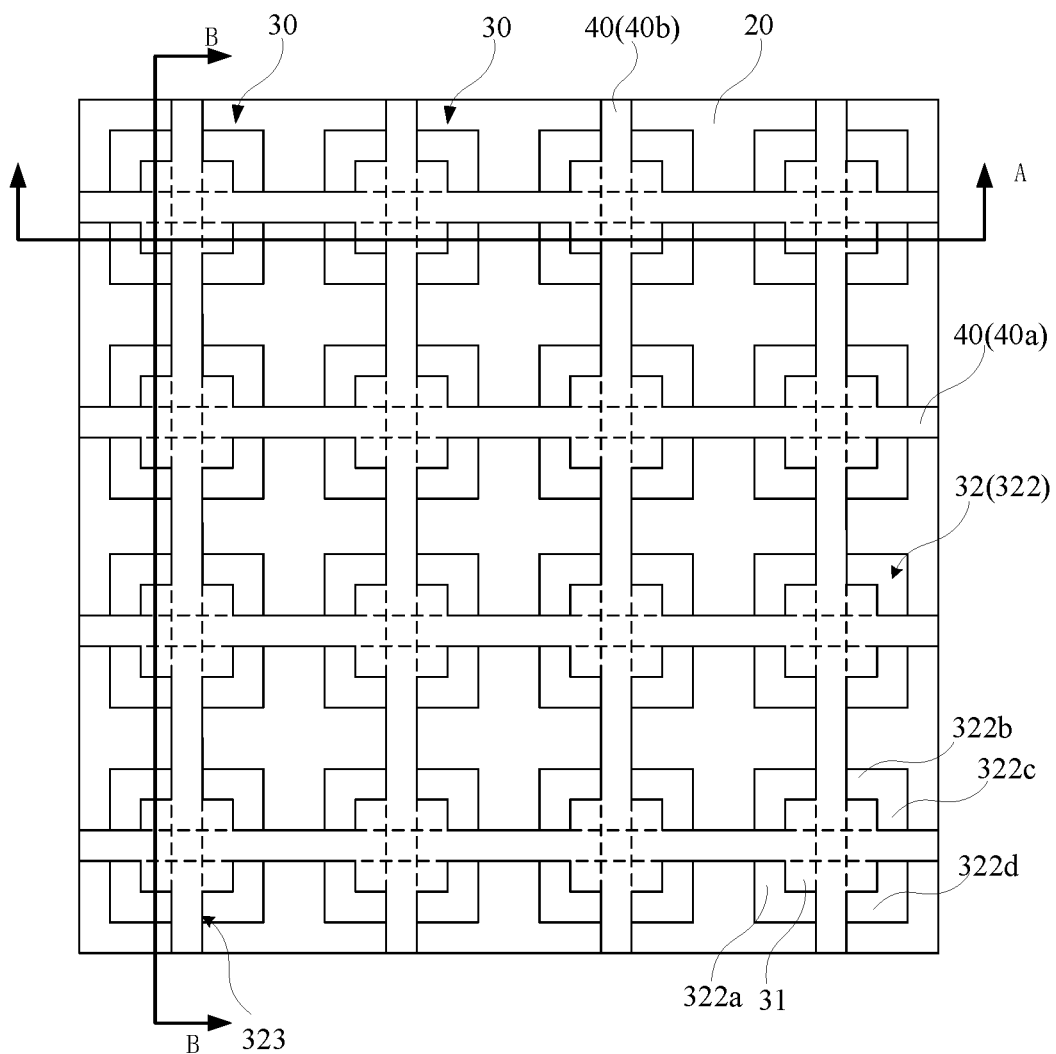
FIG. 2 is a top view structural diagram illustrating a stretchable display panel according to a second embodiment of the present disclosure.
Figure 3:
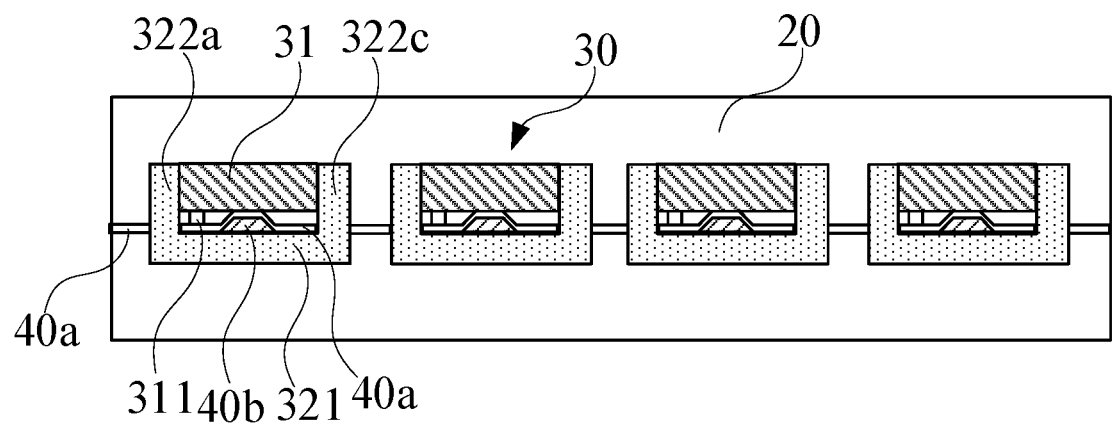
FIG. 3 is a cross-sectional diagram illustrating the stretchable display panel according to the second embodiment of the present disclosure taken along line A-A of FIG. 2.
Figure 4:
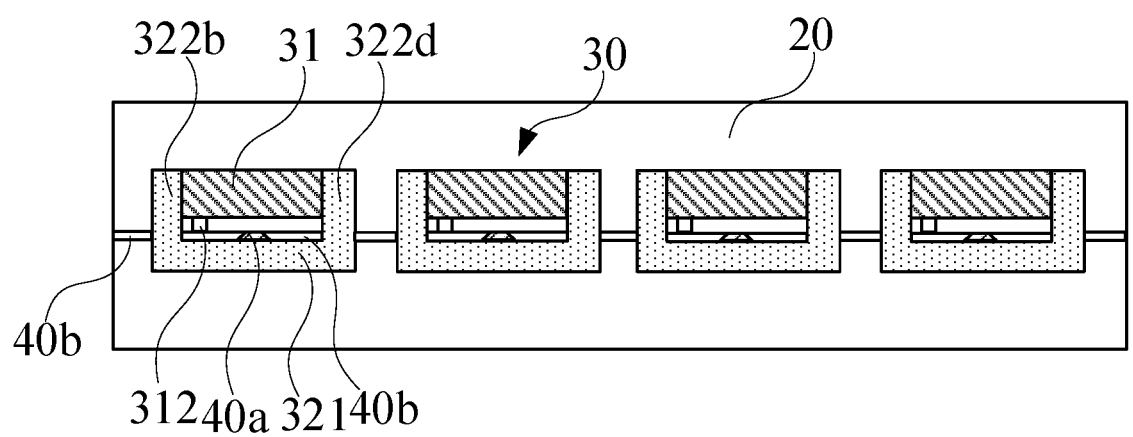
FIG. 4 is a cross-sectional diagram illustrating the stretchable display panel according to the second embodiment of the present disclosure taken along line B-B of FIG. 3.

Referring to FIG. 2, FIG. 3 and FIG. 4, FIG. 2 is a top view structural diagram illustrating a stretchable display panel according to a second embodiment of the present disclosure; FIG. 3 is a cross-sectional diagram illustrating the stretchable display panel according to the second embodiment of the present application taken along line A-A of FIG. 2; and FIG. 4 is a cross-sectional diagram illustrating the stretchable display panel according to the second embodiment of the present disclosure taken along line B-B of FIG. 3.

In the present embodiment, the stretchable display panel may include an elastic base layer 20, a plurality of display units 30, and a wire 40.

A plurality of display units 30 are embedded in the elastic base layer 20, and are arranged in an array, and each of the display units 30 includes a pixel unit 31 and a rigid protection body 32.

Alternatively, the display unit 30 may be arranged in a matrix on a same reference plane. Details could be referred to the description in the foregoing embodiment, and are not described herein again.

In the present embodiment, the rigid protection body 32 includes a rigid supporting wall 321 and four rigid sidewalls 322a, 322b, 322c, 322d.

The four rigid sidewalls 322a, 322b, 322c, 322d are connected to each other to form a rigid fence 322 surrounding the pixel unit 31. The four rigid sidewalls 322a, 322b, 322c, 322d are a first rigid sidewall 322a, a second rigid sidewall 322b, a third rigid sidewall 322c, and a fourth rigid sidewall 322d, respectively. The first rigid sidewall 322a is disposed opposite to the third rigid sidewall 322c, and the second rigid sidewall 322b is disposed opposite to the fourth rigid sidewall 322d. The first rigid sidewall 322a, the second rigid sidewall 322b, the third rigid sidewall 322c, and the fourth rigid sidewall 322d are connected end to end in sequence.

Alternatively, the first rigid sidewall 322a, the second rigid sidewall 322b, the third rigid sidewall 322c, and the fourth rigid sidewall 322d are all disposed perpendicular to the surface of the elastic base layer 20. Specifically, the rigid sidewalls 322a, 322b, 322c, 322d may be perpendicular to an upper or lower surface of the elastic base layer 20, and that the rigid sidewalls 322a, 322b, 322c, 322d being perpendicular to the elastic base layer 20 means that the rigid side walls 322a, 322b, 322c, 322d are perpendicular to the elastic base layer 20 in a natural state when the elastic base layer 20 is not deformed. In other embodiments, the rigid sidewalls 322a, 322b, 322c, 322d may also be at other angles with respective to the surface of the elastic base layer 20, and are not limited to being perpendicular.

At least one of pixel units 31 is accommodated in a space surrounded by the rigid supporting wall 321 and the rigid sidewalls 322a, 322b, 322c, 322d. Specifically, the rigid supporting wall 321 can be perpendicularly bent and connected to the rigid sidewalls 322a, 322b, 322c, 322d, and the rigid supporting wall 321 and the rigid sidewalls 322a, 322b, 322c, 322d form an integrated box-like structure. The pixel unit 31 is accommodated in an accommodating space of the box-like structure.

In the embodiment, in the above manner, the rigid fence 322 around the pixel unit 31 can protect the pixel unit 31 in the thickness dimension of the stretchable display panel. The rigid supporting wall 321 of the pixel unit 21 arranged at a bottom of the pixel unit 31 can further protect the pixel unit 31 in two dimensions of a plane lying the stretchable display panel, and therefore protection of the pixel unit 31 in three dimensions is achieved. The pixel unit 31 can be protected from damage when the stretchable display panel is stretched in any dimension or bent in any direction.

In this embodiment, the pixel unit 31 is a light emitting layer, and single-sided passive display can be realized. The light emitting layer can be an LED, an OLED, a MicroLED or a QLED.

Alternatively, the rigid sidewalls 322a, 322b, 322c, 322d are provided with a notch 323.

The wire 40 is connected to the corresponding pixel unit 31 through the notch 323 from outside of the rigid fence 322.

A portion of the wire 40 located outside the rigid fence 322 is embedded in the elastic base layer 20 and is disposed in a stretchable form. For example, at least a portion of the wire 40 located outside the rigid fence 322 is made of an elastic conductive material. It should be understood that the wire 40 may also be provided in other stretchable forms, for example, the portion of the wire 40 located outside the rigid fence 322 is provided in a spirally extending shape and is made of a hard conductive material such as metal, which is also elastic. Obviously, the stretchable form of the wire 40 is not limited to the various modes described above as long as it can be stretched.

Alternatively, a portion of the wire 40 located within the rigid fence 322 is disposed on a surface of the rigid supporting wall 321 close to the pixel unit 31. The portion of the wire 40 located within the rigid fence 322 may also be made of an elastic conductive material, and the elastic conductive material may be the same as the material of the portion of the wire 40 located outside the rigid fence 322, thereby facilitating the integral formed of the wire 40 and the manufacture of the wire 40. The specific manufacture process of the wires 40 may be a printing process or a photolithography process.

Figure 5:
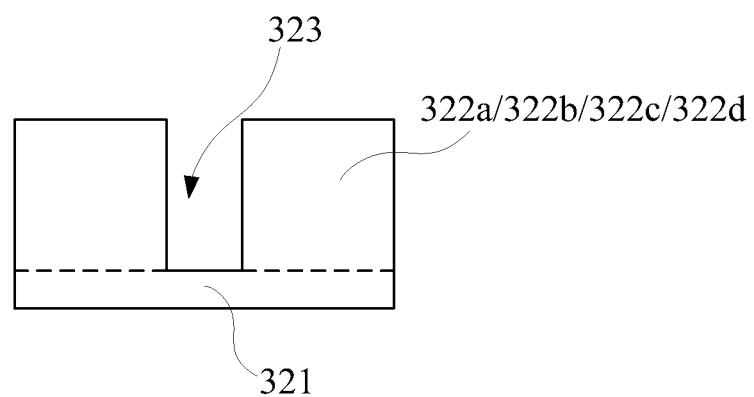
FIG. 5 is a side view structural diagram illustrating the rigid protection body according to the second embodiment of the present disclosure.
Figure 6:
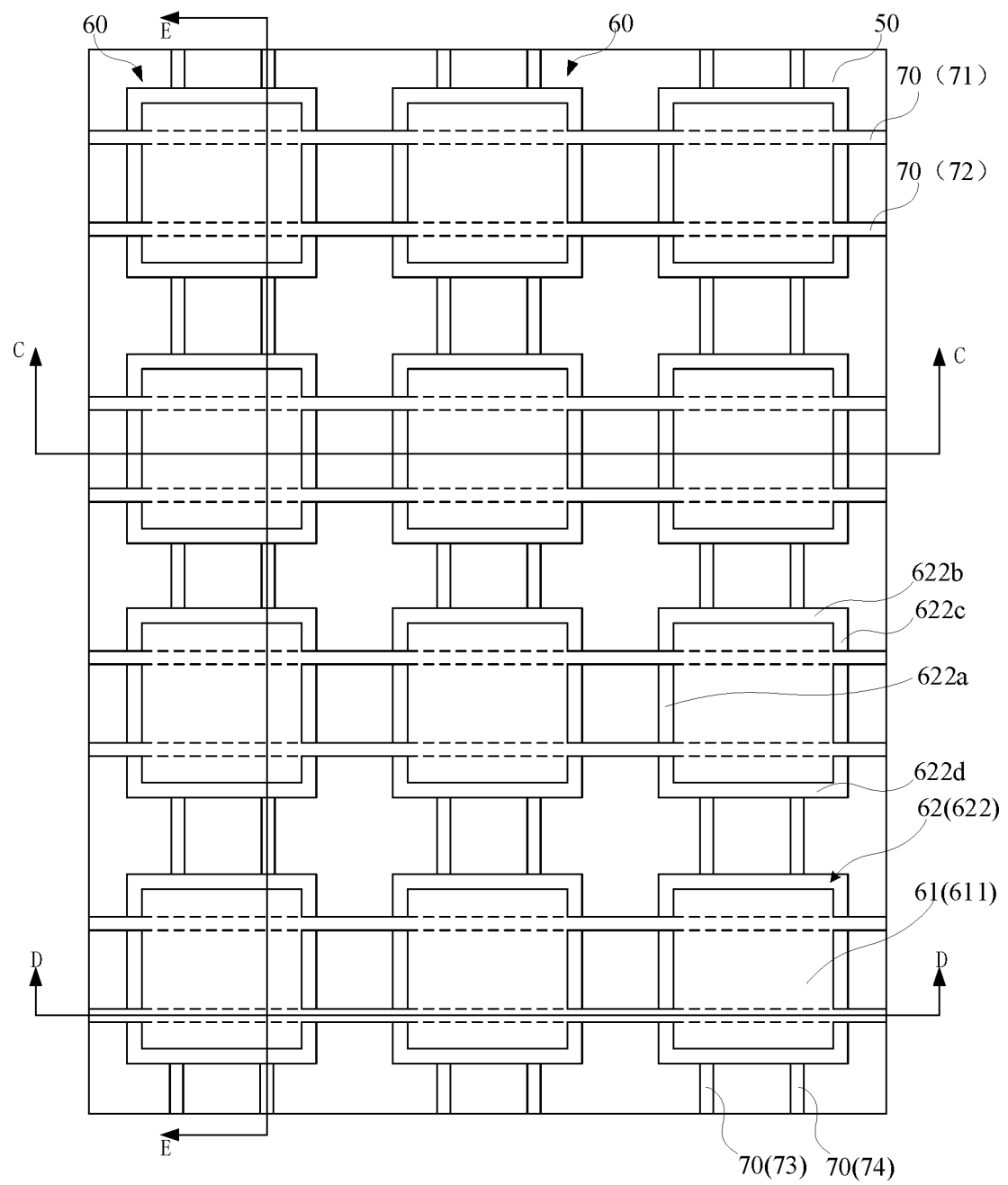
FIG. 6 is a top view structural diagram illustrating a stretchable display screen according to a third embodiment of the present disclosure.

Further description may be referred to FIG. 5. FIG. 5 is a side view structural diagram illustrating the rigid protection body according to the second embodiment of the present disclosure.

Alternatively, in the present embodiment, a bottom of the notch 323 on the rigid sidewalls 322a, 322b, 322c, 322d is disposed flush with a surface of the rigid supporting wall 321 close to the pixel unit 31, such that when the wire 40 extends from outside of the rigid fence 322 through the notch 323 into the rigid fence 322, the wire 40 remains flat, avoiding the problem of wire breakage or poor reliability of the wire 40 due to crossing a step upon passing through the notch 323 when the wire 40 is formed.

In other embodiments, the bottom of the notch 323 may also exceed a height of the surface of the rigid supporting wall 321 close to the pixel unit 31, and this embodiment of the present disclosure is not limited thereto.

Alternatively, the wire 40 includes a first wire 40a and a second wire 40b. A plurality of first wires 40a and second wires 40b may be present, the plurality of first wires 40a are disposed in parallel with each other, and the plurality of second wires 40b are disposed in parallel with each other. The first wire 40a may be perpendicular to the second wire 40b. At an intersection of the first wire 40a and the second wire 40b, an insulating layer may be disposed between the first wire 40a and the second wire 40b.

Each of the rigid sidewalls 322a, 322b, 322c, 322d at the four sides of the pixel unit 31 is provided with a notch 323.

The pixel units 31 arranged in a row are connected in series with the first wire 40a, and the first wire 40a passes through the notches 323 in two oppositely-deposited rigid sidewalls (for example, the first rigid sidewall 322a and the third rigid sidewall 322c) from outside of the rigid fence 322 and is connected to the first electrodes 311 of the pixel units 31, respectively.

The pixel units 31 arranged in a column are connected in series with the second wire 40b, and the second wire 40b passes through the notches 323 in the other two opposite rigid sidewalls (for example, the second rigid sidewall 322b and the four rigid sidewall 322d) from outside of the rigid fence 322 and is connected to the second electrodes 312 of the pixel units 31, respectively.

Alternatively, one of the first electrode 311 and the second electrode 312 of the pixel unit 31 is a positive electrode, and the other is a negative electrode. For example, when the pixel unit 31 is an OLED, one of the first electrode 311 and the second electrode 312 is the positive electrode of the OLED, and the other is the negative electrode of the OLED.

In the present embodiment, in the above manner, the wires connected with the same type of electrodes are disposed in parallel with each other, and the wires connected with the different kinds of electrodes are disposed perpendicular to each other, which can facilitate the design of the driving circuit of the display panel. It should be understood that, in other embodiments, all the wires may be disposed in parallel, and the embodiment of the present disclosure is not limited thereto.

Figure 7:
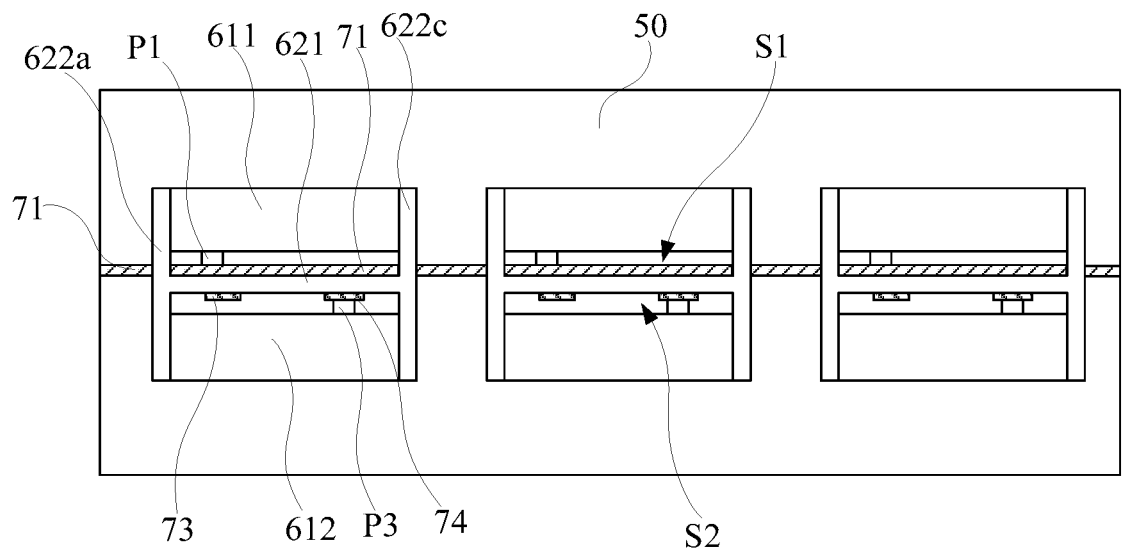
FIG. 7 is a cross-sectional structural diagram taken along line C-C of FIG. 6.
Figure 8:
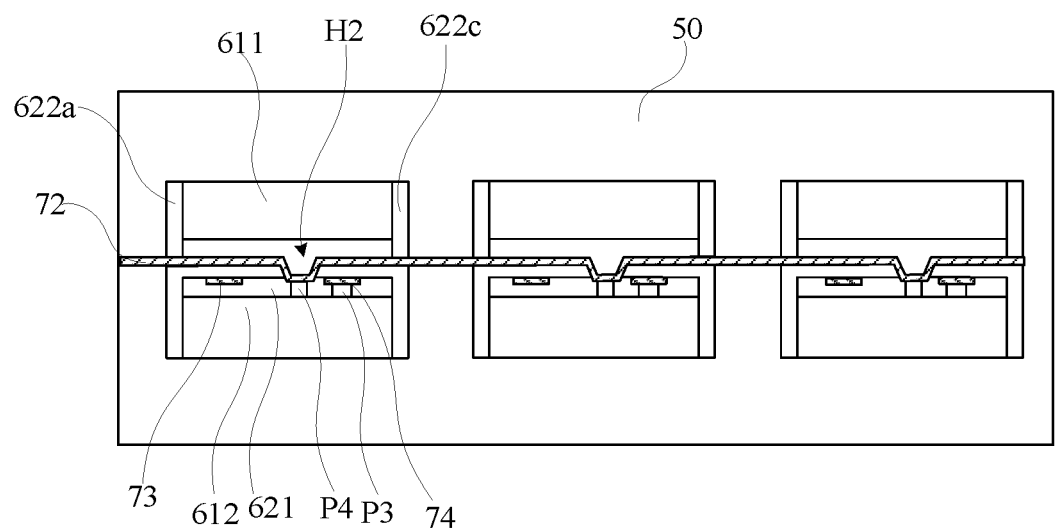
FIG. 8 is a cross-sectional structural diagram taken along line D-D of FIG. 6.
Figure 9:
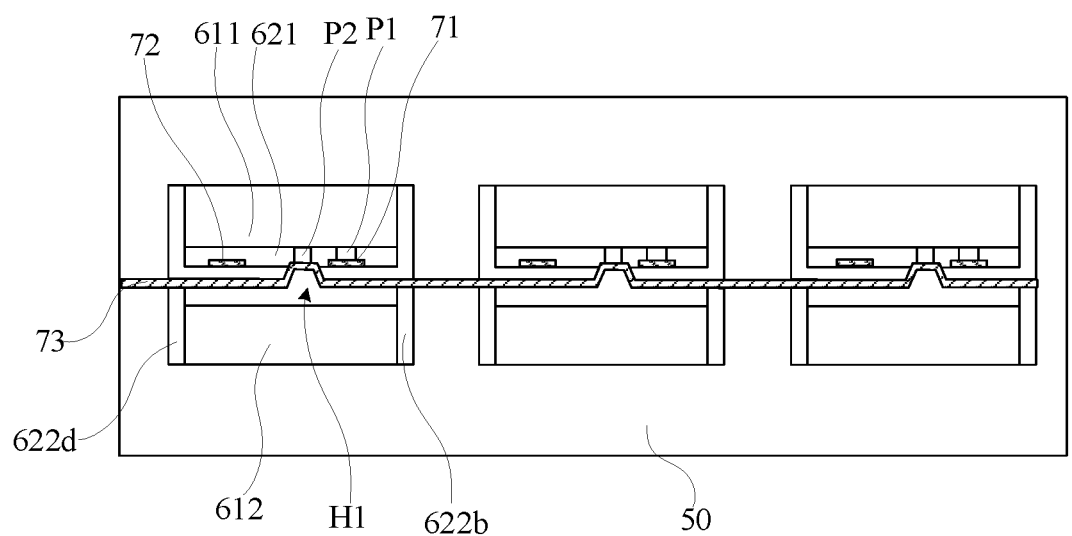
FIG. 9 is a cross-sectional structural diagram taken along line E-E of FIG. 6.

Referring to FIG. 6, FIG. 7, FIG. 8 and FIG. 9, FIG. 6 is a top view structural diagram illustrating a stretchable display screen according to a third embodiment of the present disclosure; FIG. 7 is a cross-sectional structural diagram taken along line C-C of FIG. 6; FIG. 8 is a cross-sectional structural diagram taken along line D-D of FIG. 6; and FIG. 9 is a cross-sectional structural diagram taken along line E-E of FIG. 6.

In the present embodiment, the stretchable display panel may include an elastic base layer 50, a plurality of display units 60, and a wire 70.

A plurality of display units 60 are embedded in the elastic base layer 50, and are arranged in an array, and each display unit 60 includes a pixel unit 61 and a rigid protection body 62. Details on how the display unit 60 is distributed in the array on the elastic base layer 50 may be referred to the description of the above embodiments, and are not described herein again.

The rigid protection body 62 includes a rigid supporting wall 621 and four rigid sidewalls 622a, 622b, 622c, 622d.

The four rigid sidewalls 622a, 622b, 622c, 622d are connected to each other to form a rigid fence 622 surrounding the pixel unit 61. The four rigid sidewalls 622a, 622b, 622c, 622d are a first rigid sidewall 622a, a second rigid sidewall 622b, a third rigid sidewall 622c, and a fourth rigid sidewall 622d, respectively. The first rigid sidewall 622a is disposed opposite to the third rigid sidewall 622c, and the second rigid sidewall 622b is disposed opposite to the fourth rigid sidewall 622d. The first rigid sidewall 622a, the second rigid sidewall 622b, the third rigid sidewall 622c, and the fourth rigid sidewall 622d are connected end to end in sequence.

Alternatively, the first rigid sidewall 622a, the second rigid sidewall 622b, the third rigid sidewall 622c, and the fourth rigid sidewall 622d are all disposed perpendicular to a surface of the elastic base layer 50. Details may be referred to the description of the above embodiments, and are not described herein again.

In the present embodiment, the rigid supporting wall 621 is connected to a central portion of the rigid sidewalls 622a, 622b, 622c, 622d, thereby forming a first sub-space S1 and a second sub-space S2 divided by the rigid supporting wall 621. Specifically, the rigid supporting wall 621 is connected to an inner wall of the rigid fence 622 and is integrally formed with the rigid fence 622. The rigid supporting wall 621 divides the space enclosed by the rigid fence 622 into the first sub-space S1 and the second sub-space S2.

Alternatively, the rigid supporting wall 621 is provided with a first via H1 and a second via H2.

The pixel unit 61 includes a first sub-pixel unit 611 and a second sub-pixel unit 612, and the first sub-pixel unit 611 and the second sub-pixel unit 612 are respectively accommodated in the first sub-space S1 and the second sub-space S2.

Alternatively, the first sub-pixel unit 611 may be a light emitting layer, and the second sub-pixel unit 612 may be a driving layer, such as a TFT (Thin Film Transistor) driving layer. Therefore, an active display are present at a side on which the first sub-pixel unit 611 is located.

In other embodiments, both the first sub-pixel unit 611 and the second sub-pixel unit 612 may be a light emitting layer. The light emitting layer may be an LED, an OLED, a MicroLED, or a QLED. The first sub-pixel unit 611 and the second sub-pixel unit 612 may adopt different types of light emitting layers. For example, the first sub-pixel unit adopts an OLED, and the second sub-pixel unit adopts a QLED.

The wire 70 includes a first wire 71, a second wire 72, a third wire 73, and a fourth wire 74.

Figure 10:
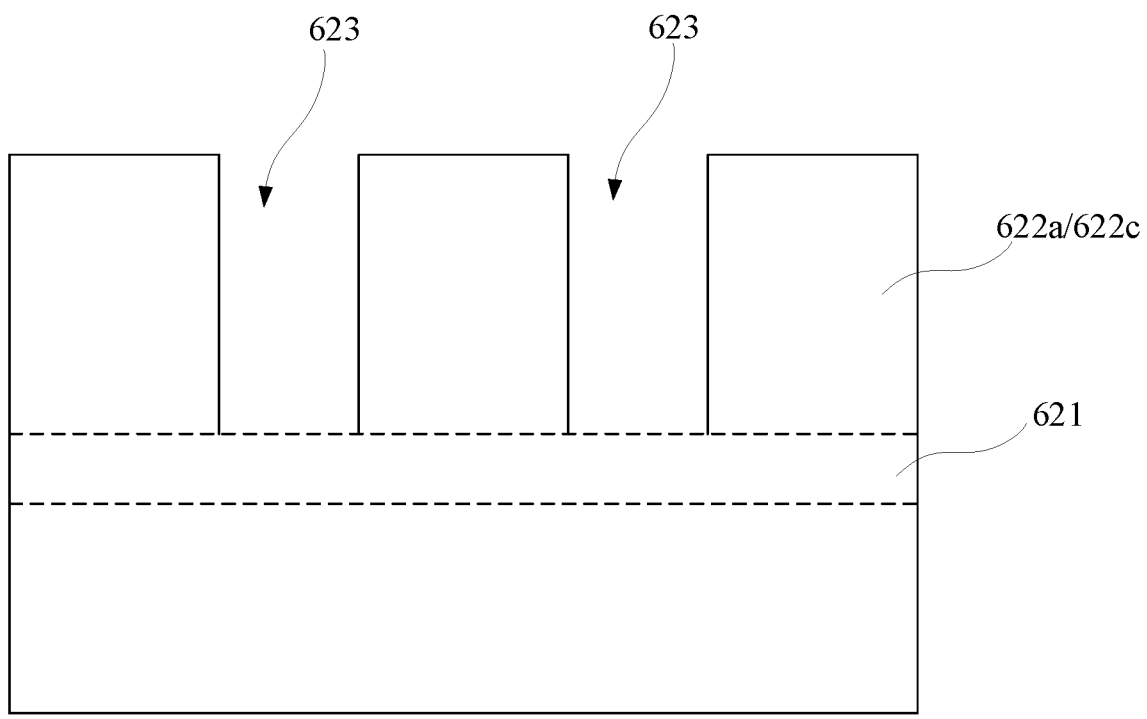
FIG. 10 is a side view structural diagram illustrating the first and third rigid sidewalls according to the third embodiment of the present disclosure.
Figure 11:
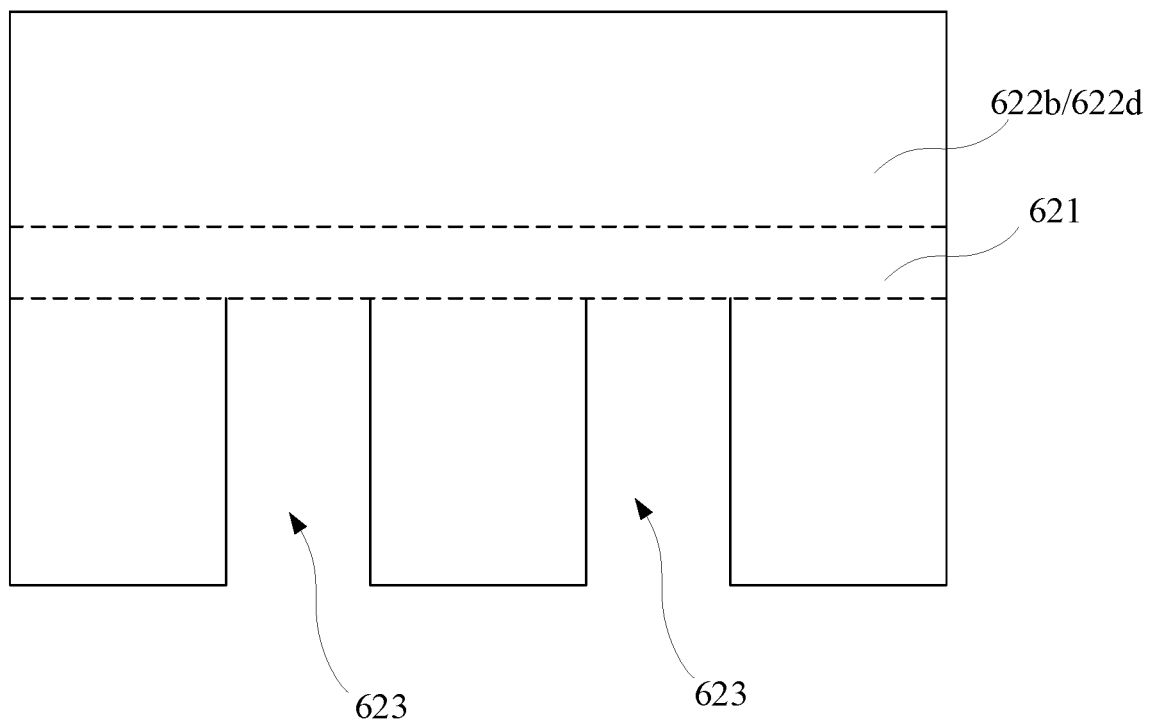
FIG. 11 is a side view structural diagram illustrating the second rigid sidewall and the fourth rigid sidewall according to the third embodiment of the present disclosure.

Referring to FIG. 10 and FIG. 11 together, FIG. 10 is a side view structural diagram illustrating the first rigid sidewall and third rigid sidewall according to the third embodiment of the present disclosure; FIG. 11 is a side view structural diagram illustrating the second rigid sidewall and the fourth rigid sidewall according to the third embodiment of the present disclosure.

The rigid fence 622 is provided with a plurality of notches 623 corresponding to the first wire 71, the second wire 72, and the third wire 73. Each wire 70 corresponds to two notches 623 respectively located on two opposite rigid sidewalls 622a, 622b, 622c or 622d.

Specifically, a portion of the first rigid sidewall 622a on the upper side of the rigid supporting wall 621 (i.e., a portion of the first rigid sidewall 622a at a side of the first sub-pixel unit 611) is provided with two notches 623 open to a direction away from the rigid supporting wall 621 and communicating inside of the rigid fence 622 with outside of rigid fence 622. A portion of the third rigid sidewall 622c on the upper side of the rigid supporting wall 621 (i.e., a portion of the third rigid sidewall 622c at a side of the first sub-pixel unit 611) is provided with two notches 623 open to a direction away from the rigid supporting wall 621 and communicating inside of the rigid fence 622 with outside of rigid fence 622.

A portion of the second rigid sidewall 622b on the lower side of the rigid supporting wall 621 (i.e., a portion of the second rigid sidewall 622b at a side of the second sub-pixel unit 611) is provided with two notches 623 open to a direction away from the rigid supporting wall 621 and communicating inside of the rigid fence 622 with outside of rigid fence 622.

A portion of the second rigid sidewall 622d on the lower side of the rigid supporting wall 621 (i.e., a portion of the second rigid sidewall 622d at a side of the second sub-pixel unit 611) is provided with two notches 623 open to a direction away from the rigid supporting wall 621 and communicating inside of the rigid fence 622 with outside of rigid fence 622.

Alternatively, a bottom of each notch 623 is flush with a surface of the rigid supporting wall 621 close to the notch 623 to keep the corresponding wire 70 flat as the corresponding wire 70 passes through the notch 623.

The first wire 71 and the second wire 72 extend from outside of the rigid fence 622 into the first sub-space S1 through the notch 623. Portions of the first wire 71 and the second wire 72 located within the rigid fence 622 are all disposed on the rigid supporting wall 621. The third wire 73 and the fourth wire 74 extend from outside of the rigid fence 622 into the second sub-space S2. The first electrode P1 of the first sub-pixel unit 611 is connected to the first wire 71. The second electrode P2 of the first sub-pixel unit 611 is connected to the third wire 73 through the first via H1. The first electrode P3 of the second sub-pixel unit 612 is connected to the fourth wire 74. The second electrode P4 of the second sub-pixel unit 612 is connected to the second wire 72 through the second via H2. The first wire 71 is parallel to the second wire 72, the third wire 73 is parallel to the fourth wire 74, and the first wire 71 is perpendicular to the third wire 73.

Specifically, the first sub-pixel units 611 arranged in a row are connected in series with the first wire 71, and the first wire 71 passes through notches 623 in two opposite rigid sidewalls (for example, the first rigid sidewall 622a and the third rigid sidewall 622c) from outside of the rigid fence 622, and is connected to the first electrode P1 of the first sub-pixel unit 611. The second sub-pixel units 612 arranged in a row are connected in series with the second wire 72, and the second wire 72 extends from outside of the rigid fence 622 into the first sub-space S1 through notches 623 in two opposite rigid sidewalls (for example, the first rigid sidewall 622a and the third rigid sidewall 622c). The second wire 72 is connected to the second electrode P2 of the second sub-pixel unit 612 through the second via H2 disposed on the rigid supporting wall 621. The second wire 72, when passing through the second via H2, is filled into the second via H2, and is connected to and communicated with the second electrode P4 of the second sub-pixel unit 612 in the second sub-space S2.

The second sub-pixel units 612 arranged in a column are connected in series with the four wire 74, and the four wire 74 passes through notches 623 in two opposite rigid sidewalls (for example, the second rigid sidewall 622b and the four rigid sidewall 622d) from outside of the rigid fence 622, and is connected to the first electrode P3 of the second sub-pixel units 612. The first sub-pixel units 611 arranged in a column are connected in series with the third wire 73, and the third wire 73 extends from outside of the rigid fence 622 into the second sub-space S2 through notches 623 in two opposite rigid sidewalls (for example, the second rigid sidewall 622b and the fourth rigid sidewall 622d). The third wire 73 is connected to the second electrode P2 of the first sub-pixel unit 611 through the first via H1 disposed on the rigid supporting wall 621. The third wire 73, when passing through the first via H1, is filled into the first via H1, and is connected to and communicated with the second electrode P2 of the first sub-pixel unit 611 in the first sub-space S1.

Alternatively, one of the first electrode P1 and the second electrode P2 of the first sub-pixel unit 611 is a positive electrode and the other is a negative electrode.

Alternatively, when the second sub-pixel unit 612 is a light-emitting layer, one of the first electrode P3 and the second electrode P4 of the second sub-pixel unit 612 is a positive electrode and the other is a negative electrode. When the second sub-pixel unit 612 is a driving layer, one of the first electrode P3 and the second electrode P4 of the second sub-pixel unit 612 is a data line-connecting electrode and the other is a scan line-connecting electrode, for example, one of the first electrode P3 and the second electrode P4 of the second sub-pixel unit 612 is a gate electrode and the other is a drain electrode.

In this embodiment, depositing different kinds of electrodes in different layers can avoid an intersecting arrangement of the wires in a same sub-space, which causes the disposition of insulating layer at an intersecting position of the wires for wire insulation. On the basis of this, the same kind of electrodes are further disposed parallel to each other, which may facilitate the design of the peripheral driving circuit.

In another embodiment, the plurality of wires may include a first wire, a second wire, a third wire, and a fourth wire. The first wire and the second wire extend from outside of the rigid fence into the first sub-space, and the third wire and the fourth wire extend from outside of the rigid fence into the second sub-space. The first electrode of the first sub-pixel unit is connected to the first wire, the second electrode of the first sub-pixel unit is connected to the second wire, the first electrode of the second sub-pixel unit is connected to the third wire, and the second electrode of the second sub-pixel unit is connected to the fourth wire. The first wire is parallel to the third wire, the second wire is parallel to the fourth wire, and the first wire is perpendicular to the second wire. In this case, the structures on the upper and lower sides of the rigid supporting wall are similar to the single layer structure (display unit 30) in the second embodiment, and will not be described herein again. This arrangement has an advantage that no via is need to be provided in the rigid supporting wall, and the wires connecting the same type of electrodes are parallel, which can also have an effect of facilitating the design of the peripheral driving circuit.

In this embodiment, the first sub-pixel unit 611 and the second sub-pixel unit 612 are both flush with or completely accommodated in the rigid protection body 62, and do not exceed the first sub-space S1 and the second sub-space S2. In this way, this can prevent the first base pixel unit 611 and the second sub-pixel unit 612 from being damaged by the forces generated between the elastic base layer 50 and the first sub-pixel unit 611, and between the elastic base layer 50 and the second sub-pixel unit 612 when the elastic base layer 50 is stretched. In other embodiments, in order to facilitate the mounting or manufacture of the first sub-pixel unit 611 and the second sub-pixel unit 612, the first sub-pixel unit 611 may exceed the first sub-space S1, and the second sub-pixel unit 612 may exceed the second sub-space S2.

In each of the above embodiments, each pixel unit may further include a corresponding plurality of sub-pixel units, for example, each of the pixel units may include a red sub-pixel unit (R), a green sub-pixel unit (G), and a blue sub-pixel unit (B), or each pixel unit may include a red sub-pixel unit (R), a green sub-pixel unit (G), a blue sub-pixel unit (B), and a white sub-pixel unit (W).

In the above embodiments, the two electrodes of the pixel unit or the sub-pixel unit are located in a same layer of the pixel unit. It should be understood that in other embodiments, the two electrodes of the pixel unit may also be located in different layers respectively, when the electrodes of the pixel unit are in different layers, the corresponding wires can be in different layers.

Figure 12:
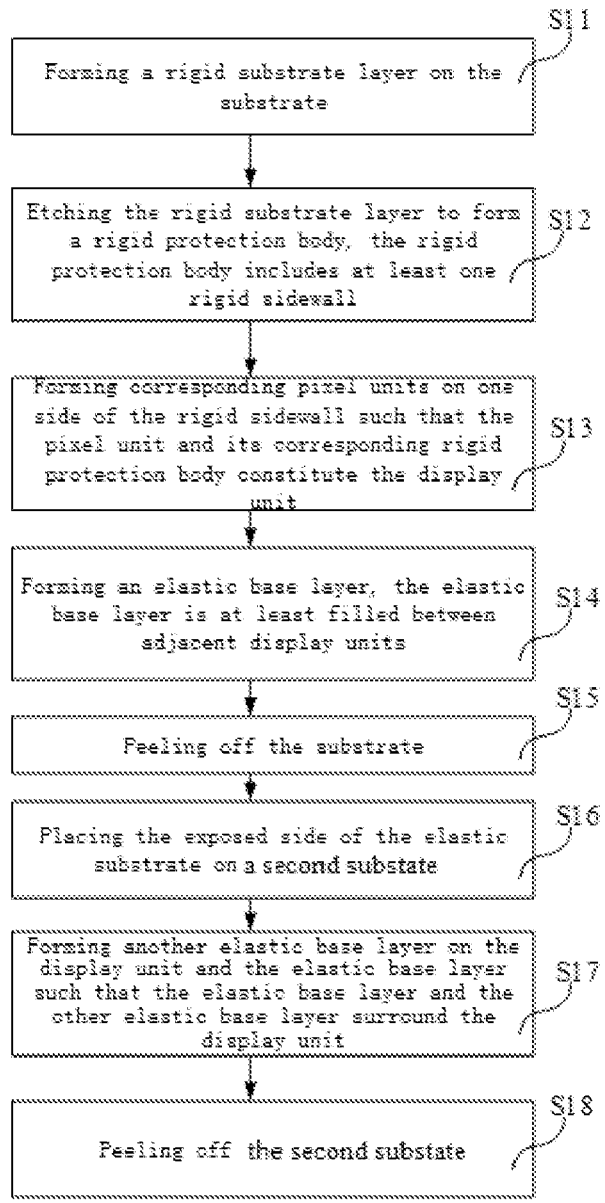
FIG. 12 is a schematic flow chart illustrating a first embodiment of a method of manufacturing a stretchable display panel according to the present disclosure.
Figure 13:
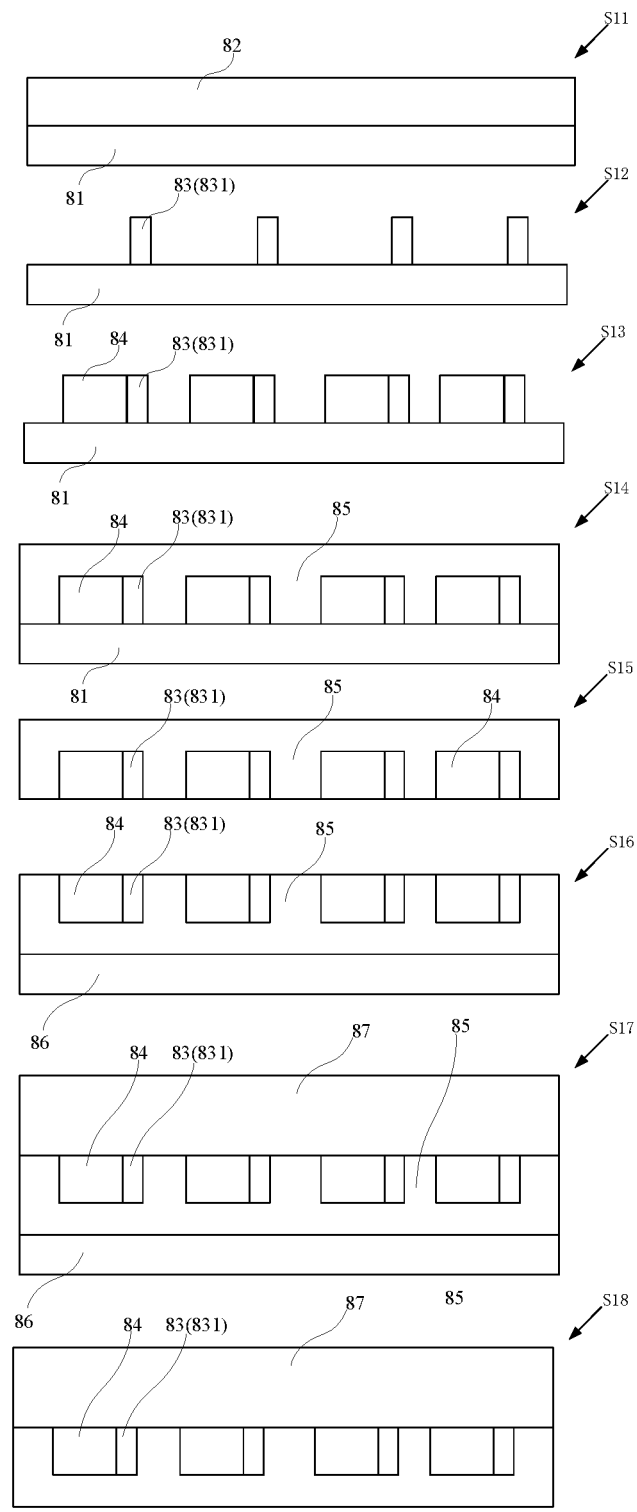
FIG. 13 is a schematic diagram illustrating a manufacturing process of a first embodiment of a method of manufacturing a stretchable display panel according to the present disclosure.

Referring to FIG. 12 and FIG. 13, FIG. 12 is a schematic flow chart illustrating a first embodiment of a method of manufacturing a stretchable display panel according to the present disclosure, and FIG. 13 is a schematic diagram illustrating a manufacturing process of a first embodiment of a method of manufacturing a stretchable display panel of the present disclosure. In this embodiment, the manufacturing method of the stretchable display panel may include the following steps:

Step S11: forming a rigid substrate layer on a substrate.

The rigid substrate layer 82 is formed on the substrate 81. The rigid substrate layer 82 is made of a rigid material such as PI (polyimide), PMMA (polymethyl methacrylate) or other patternable rigid materials.

Step S12: etching the rigid substrate layer to form a rigid protection body, the rigid protection body includes at least a rigid sidewall.

The rigid substrate layer 82 is etched to form a rigid protection body 83. Alternatively, the rigid protection body 83 includes one rigid sidewall 831. In other embodiments, the rigid protection body can include two or more rigid sidewalls. The formed rigid protective bodies 83 may be distributed in a matrix on the substrate 81.

For example, in other embodiments, etching the rigid substrate layer 82 to form the rigid protection body 83 may include etching the rigid substrate layer 82 to form a plurality of rigid sidewalls corresponding to the four sides of a pixel unit formed in the subsequent step. The plurality of rigid sidewalls are connected to each other to form a rigid fence surrounding the pixel unit.

Details may be referred to the above description.

Step S13: forming a corresponding pixel unit at a side of the rigid sidewall such that the pixel unit and corresponding rigid protection body of the pixel unit constitute a display unit.

A corresponding pixel unit 84 is formed on a side of the rigid sidewall 831 such that the pixel unit 84 and corresponding rigid protection body 83 of the pixel unit 84 constitute the display unit.

Step S14: forming an elastic base layer, the elastic base layer is filled at least between adjacent display units.

The elastic base layer 85 is formed, and the elastic base layer is filled at least between adjacent display units. Alternatively, a portion of the elastic base layer 85 is filled between adjacent pixel units, the other portion of the elastic base layer 85 is located on the display unit, and an outer surface of the formed elastic base layer 85 is perpendicular to the rigid sidewall 831.

Step S15: peeling off the substrate.

The substrate 81 is peeled off.

Alternatively, after the step S15, the method of manufacturing the stretchable display panel may further include:

Step S16: placing an exposed surface of the elastic base layer on a second substrate.

An exposed surface of the elastic base layer 85 is placed on a second substrate 86.

Step S17: forming another elastic base layer on the display unit and the elastic base layer such that the display unit is encased by the elastic base layer and the another elastic base layer.

Another elastic base layer 87 is formed on the display unit and the elastic base layer 85 such that the display unit is encased by the elastic base layer 85 and the another elastic base layer. The elastic base layer 85 and the another elastic base layer 87 have an elastic material, specifically PDMS (polydimethylsiloxane), PU (polyurethane), TPE (thermoplastic elastomer) or other elastic or flexible material. The another elastic base layer 87 formed may has a surface perpendicular to the rigid sidewall 831.

Step S18: peeling off the second substrate.

The second substrate 86 is peeled off.

Figure 14:
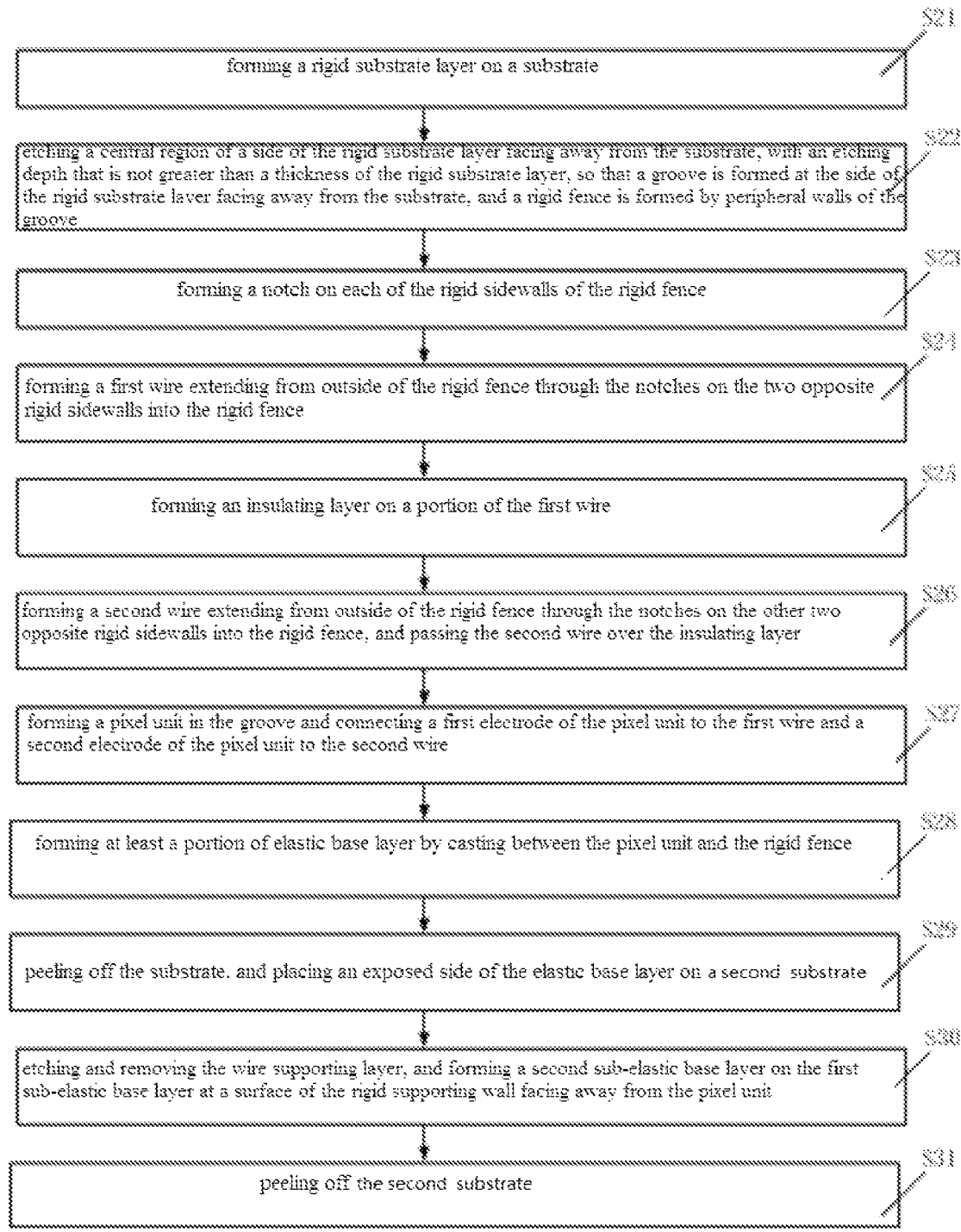
FIG. 14 is a schematic flow chart illustrating a second embodiment of a method of manufacturing a stretchable display panel according to the present disclosure.
Figure 15:
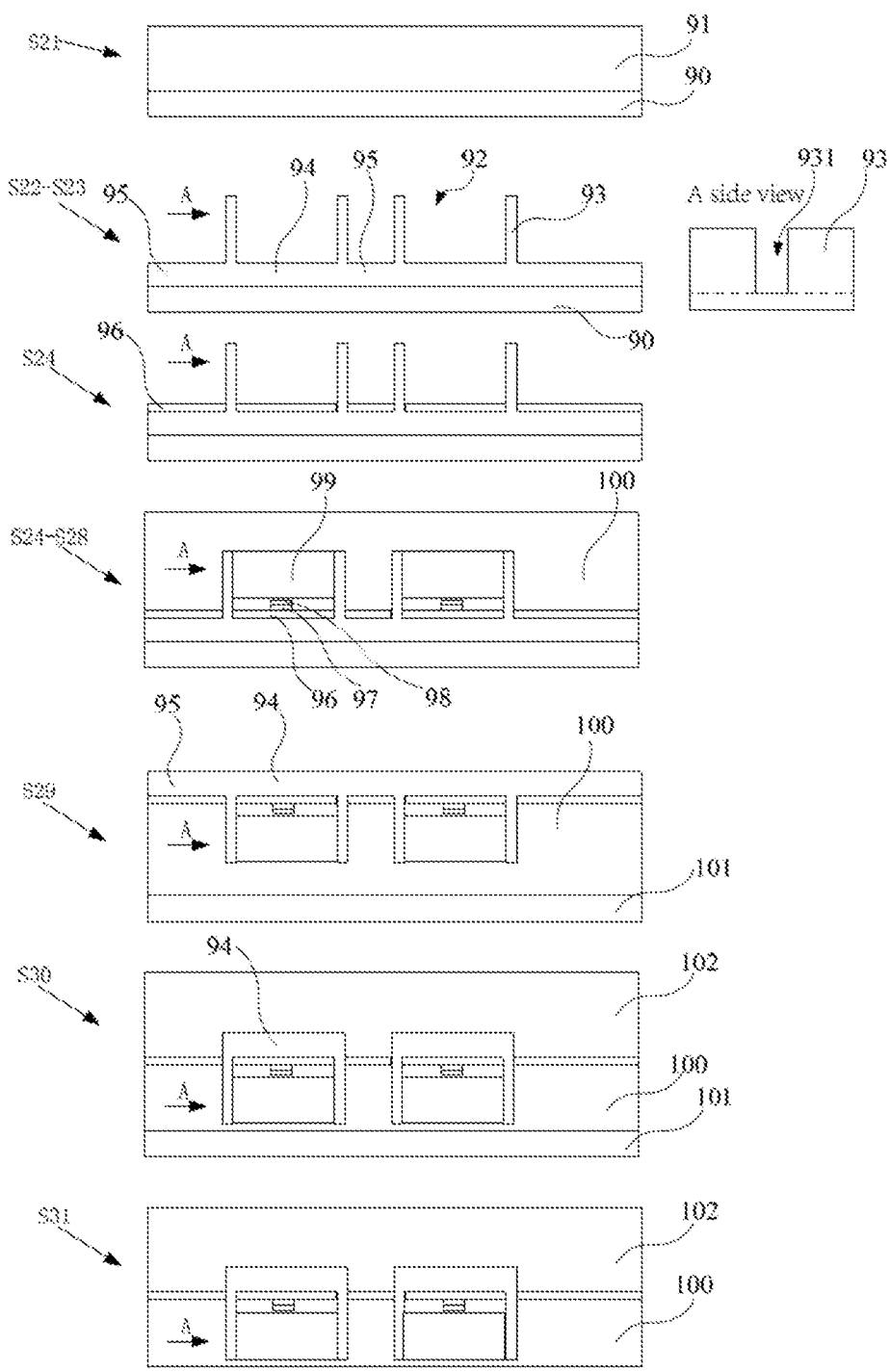
FIG. 15 is a schematic diagram illustrating a manufacturing process of a second embodiment of a method of manufacturing a stretchable display panel according to the present disclosure.

Referring to FIG. 14 and FIG. 15, FIG. 14 is a schematic flow chart illustrating a second embodiment of a method of manufacturing a stretchable display panel according to the present disclosure, and FIG. 15 is a schematic diagram illustrating a manufacturing process of a second embodiment of a method of manufacturing a stretchable display panel according to the present disclosure.

In this embodiment, the method of manufacturing the stretchable display panel may include the following steps.

Step S21: forming a rigid substrate layer on a substrate.

A rigid substrate material layer 91 is formed on the substrate 90. The rigid substrate layer 91 is made of a rigid material such as PI (polyimide), PMMA (polymethyl methacrylate) or other patternable rigid materials.

Step S22: etching a central region of a side of the rigid substrate layer facing away from the substrate, with an etching depth that is not greater than a thickness of the rigid substrate layer, so that a groove is formed at the side of the rigid substrate layer facing away from the substrate, and a rigid fence is formed by peripheral walls of the groove.

The middle region of a side of the rigid substrate layer 91 facing away from the substrate 90 is etched into a depth that is not greater than the thickness of the rigid substrate layer 91 such that a groove 92 is formed at the side of the rigid substrate layer 91 facing away from the substrate 90, and a rigid fence 93 is formed by peripheral walls of the groove 92. A rigid supporting wall 94 is formed by an unetched portion in a bottom of the groove 92. The peripheral walls of the groove 92 are formed by a plurality of rigid sidewalls that are connected end to end to form a rigid fence 93.

During etching, a portion of the rigid substrate layer 91 outside the rigid fence 93 is also etched to a certain extent with an etching depth that is the same as the depth of the groove 92, and the remaining portion forms a wire supporting layer 95, and an upper surface of the wire supporting layer 95 is flush with an upper surface of the rigid supporting wall 94.

Step S23: forming a notch on each of the rigid sidewalls of the rigid fence.

A notch 931 is formed on each of the rigid sidewalls of the rigid fence 93. Details may be referred to the A side view of the rigid fence 93 in the figure, the other side views are similar to the A side view. Alternatively, a bottom of the notch 931 is flush with a surface of the rigid supporting wall 94 facing away from the substrate 90.

Step S24: forming a first wire extending from outside of the rigid fence into the rigid fence through the notches on the two opposite rigid sidewalls.

A first wire 96 extending from outside of the rigid fence 93 into the rigid fence 93 through the notch 931 in the two opposite rigid sidewalls is formed on the wire supporting layer 95, the bottom of the notch 931, and the rigid supporting wall 94. The first wire 96 can be stretched. For example, the material of the first wire 96 may be an elastic conductive material. In other embodiments, only the portion of the first wire 96 located outside the rigid fence 93 may be made of an elastic wire material, and the portion of the first wire 96 located within the rigid fence 93 is made of hard conductive material.

Step S25: forming an insulating layer on a portion of the first wire.

The insulating layer 97 is formed on a portion of the first wire 96 so that the second wire 98 subsequently formed and the first wire 96 can be insulated from each other at an intersecting position.

Step S26: forming a second wire extending from outside of the rigid fence into the rigid fence through the notches on the other two opposite rigid sidewalls, and passing the second wire over the insulating layer.

A second wire 98 extending from outside of the rigid fence 93 into the rigid fence 93 through the notches 931 in the other two opposite rigid sidewalls is formed on the wire supporting layer 95, the bottom of the notch 931, and the rigid supporting wall 94, and passes over the insulating layer 97. The second wire 98 is also stretchable and specifically similar to the first wire 96, except that the second wire 98 is set in a different direction, and details are not described herein again.

Step S27: forming a pixel unit in the groove and connecting a first electrode of the pixel unit to the first wire and a second electrode of the pixel unit to the second wire.

The pixel unit 99 is formed in the groove 92, the first electrode of the pixel unit 99 is connected to the first wire 96, and the second electrode of the pixel unit 99 is connected to the second wire 98. The pixel unit 99 may be a light emitting layer, and the light emitting layer may specifically be an LED, an OLED, a MicroLED, a QLED, and the like.

The first electrode and the second electrode are not shown in the figure. A connection relationship between the electrode of the specific pixel unit and the wire may be specifically referred to related description in the second embodiment of the above-mentioned stretchable display panel, and are not described herein again.

Step S28: forming at least a portion of elastic base layer by casting between the pixel unit and the rigid fence.

At least a portion of elastic base layer 100 is formed by casting between the pixel unit 99 and the wire carrying layer 95, and the portion of elastic base layer 100 is defined as a first sub-elastic base layer 100.

Step S29: peeling off the substrate, and placing an exposed side of the elastic base layer on a second substrate.

An exposed side of the elastic base layer 100 is placed on a second substrate 101.

Step S30: etching and removing the wire supporting layer, and forming a second sub-elastic base layer on the first sub-elastic base layer at a surface of the rigid supporting wall facing away from the pixel unit.

The wire supporting layer 95 is etched and removed, and a second sub-elastic substrate 102 is formed on the first sub-elastic substrate 100 at a surface of the rigid supporting wall 94 facing away from the pixel unit 99. The first sub-elastic base layer 100 and the second sub-elastic base layer 102 constitute a complete elastic base layer, and the first wire 96 and the second wire 98 are encased by the elastic base layer.

Step S31: peeling off the second substrate.

The second substrate 101 is peeled off.

This embodiment corresponds to the structure of the second embodiment of the above-mentioned stretchable display panel. More details may be referred to the above description, and are not described herein again.

Figure 16:
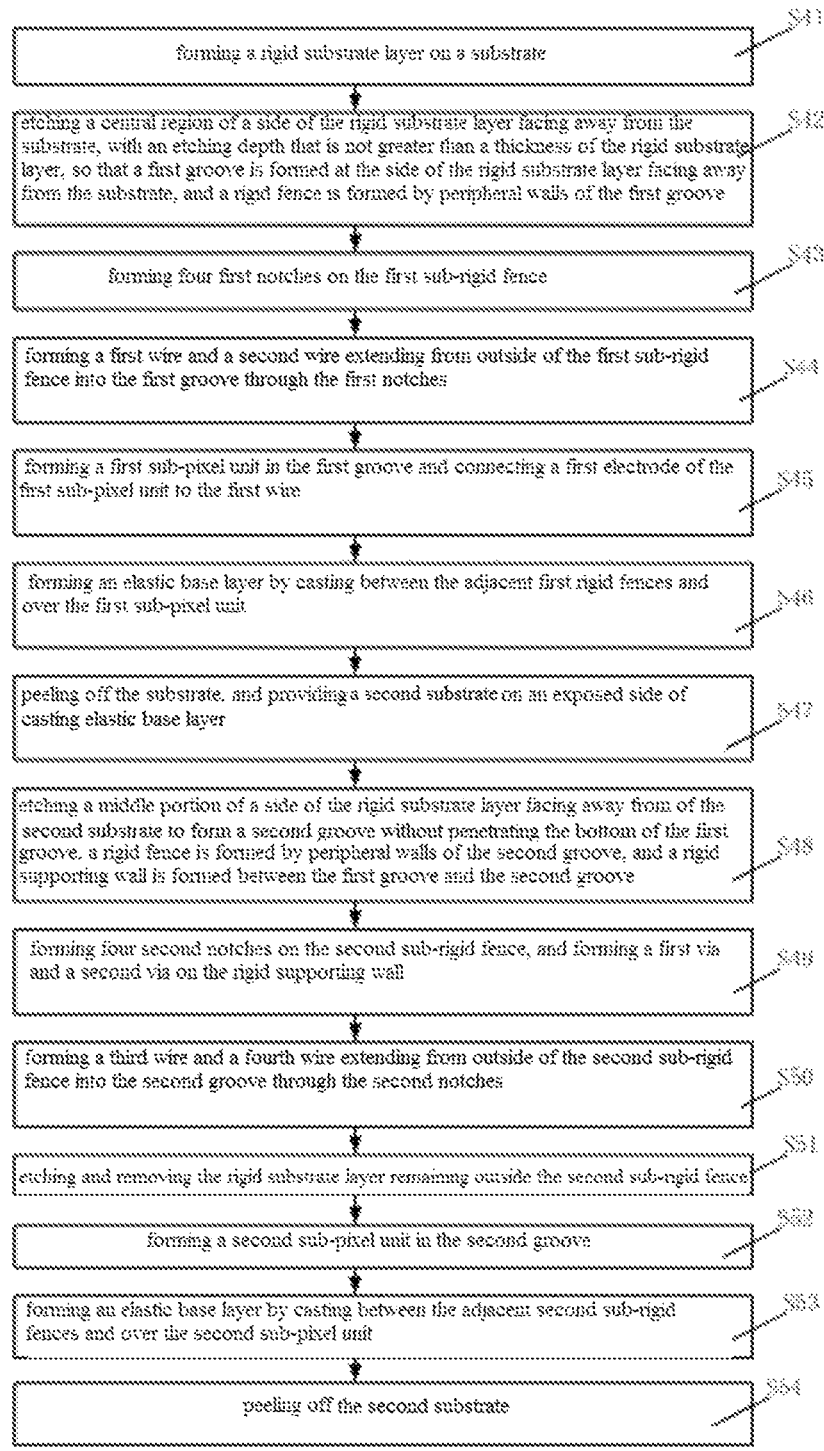
FIG. 16 is a schematic flow chart illustrating a third embodiment of a method of manufacturing a stretchable display panel according to the present disclosure.
Figure 17:
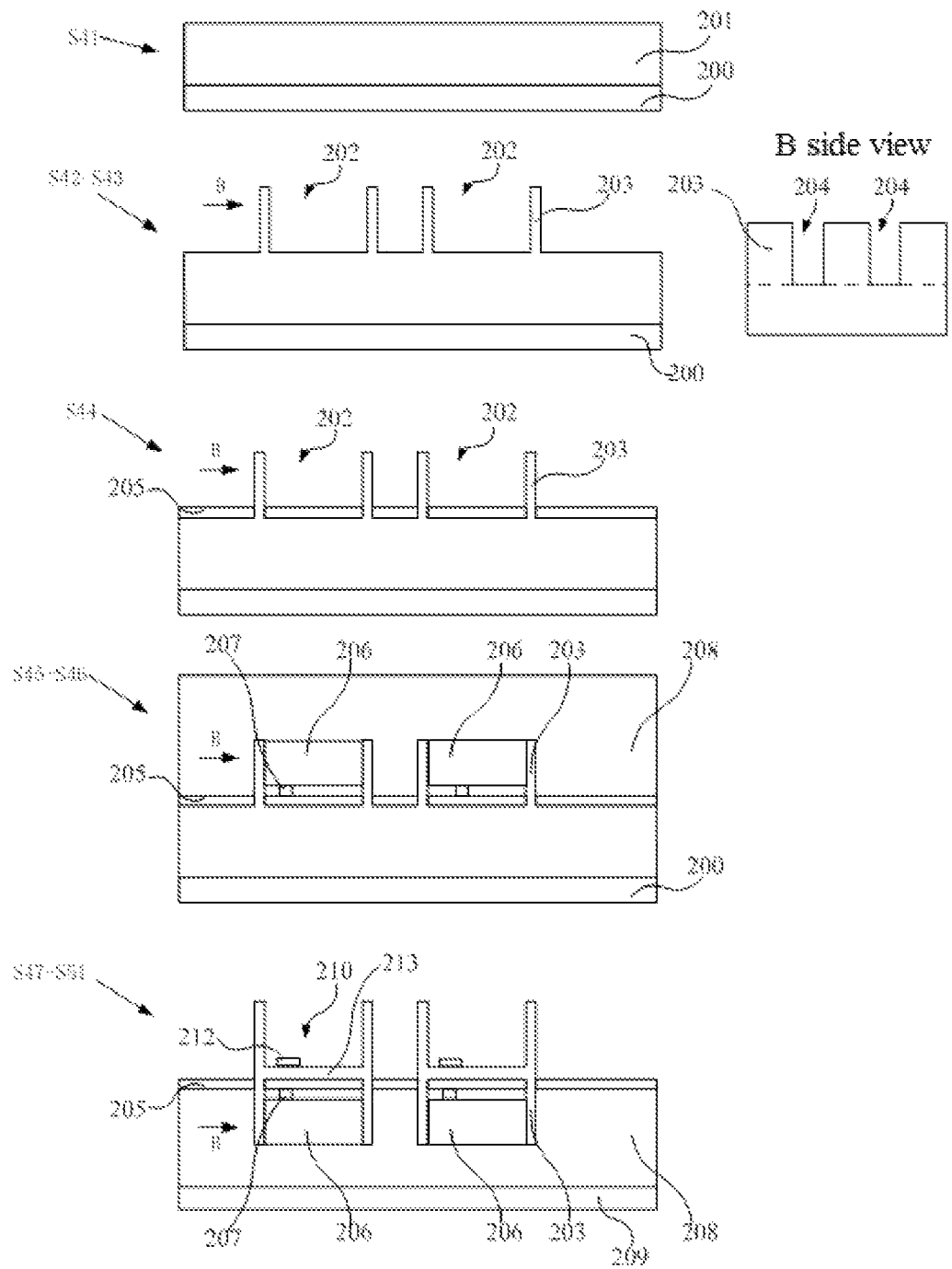
FIG. 17 is a schematic diagram illustrating a part of manufacturing process of a third embodiment of a method of manufacturing a stretchable display panel according to the present disclosure.
Figure 18:
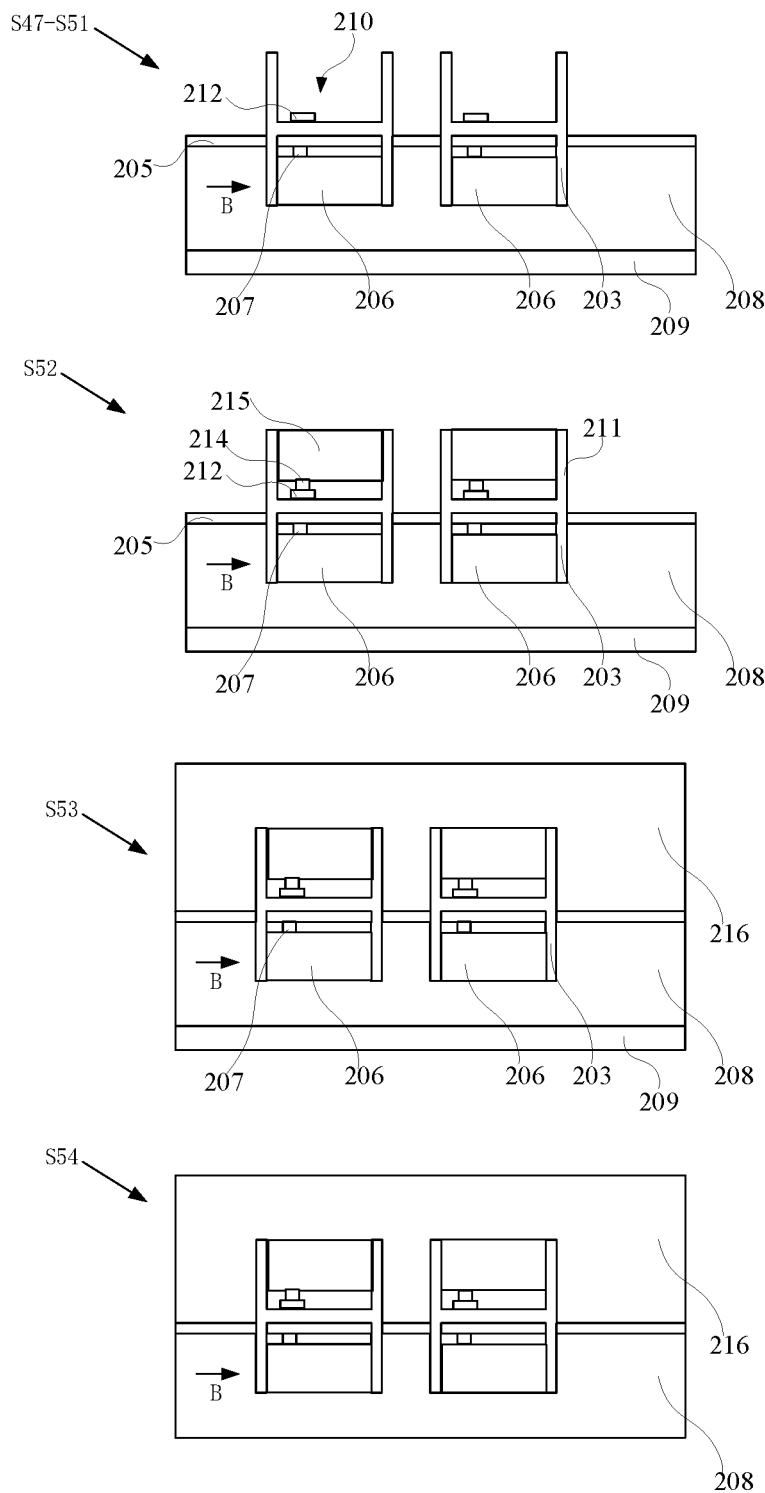
FIG. 18 is a schematic diagram illustrating another part of the manufacturing process of the third embodiment of the method of manufacturing the stretchable display panel according to the present disclosure.

Referring to FIG. 16, FIG. 17 and FIG. 18, FIG. 16 is a flow chart illustrating a third embodiment of a method of manufacturing a stretchable display panel according to the present disclosure. FIG. 17 is a schematic diagram illustrating a part of manufacturing process of a third embodiment of a method of manufacturing a stretchable display panel according to the present disclosure; FIG. 18 is a schematic diagram illustrating another part of the manufacturing process of the third embodiment of the method of manufacturing the stretchable display panel according to the present disclosure.

In this embodiment, the method of manufacturing the stretchable display panel may include the following steps.

Step S41: forming a rigid substrate layer on a substrate.

A rigid substrate layer 201 is formed on the substrate 200. The rigid substrate layer 201 is made of a rigid material such as PI (polyimide), PMMA (polymethyl methacrylate) or other patternable rigid materials.

Step S42: etching a central region of a side of the rigid substrate layer facing away from the substrate, with an etching depth that is not greater than a thickness of the rigid substrate layer, so that a first groove is formed at the side of the rigid substrate layer facing away from the substrate, and a rigid fence is formed by peripheral walls of the first groove.

A central region of a side of the rigid substrate layer 201 facing away from the substrate 20 is etched with an etching depth that is not greater than a thickness of the rigid substrate layer 201, so that a first groove 202 is formed at the side of the rigid substrate layer 201 facing away from the substrate, and a sub-rigid fence of the rigid fence is formed by peripheral walls of the first groove 202.

At etching, a portion of the rigid substrate layer outside the first rigid fence 203 is also etched to a certain depth, and the remaining supporting portion is configured to support a wire subsequently formed.

Step S43: forming four first notches on the first sub-rigid fence.

Two first notches 204 are respectively formed on the two opposite rigid sidewalls of the first sub-rigid fence 203.

Step S44: forming a first wire and a second wire extending from outside of the first sub-rigid fence into the first groove through the first notches.

The first wire 205 is parallel to the second wire (not shown). The first wire 205 passes through two opposite first notches 204, and the second wire passes through the other two opposite first notches 204. Details may be referred to the description in the third embodiment of the above stretchable display panel.

Step S45: forming a first sub-pixel unit in the first groove and connecting a first electrode of the first sub-pixel unit to the first wire.

A first sub-pixel unit 206 is formed in the first groove 202, and a first electrode 207 of the first sub-pixel unit 206 and a second electrode (not shown) of the first sub-pixel unit 206 abut with a bottom of the first groove 202.

Step S46: forming an elastic base layer by casting between the adjacent first rigid fences and over the first sub-pixel unit.

A portion 208 of the elastic base layer is formed by casting between the adjacent first rigid fences and over the first sub-pixel unit 206.

Step S47: peeling off the substrate, and providing a second substrate on an exposed side of casting elastic base layer.

The substrate 200 is peeled off, and a part 208 of the cast elastic base layer is inverted and an exposed side of the casting elastic base layer is bonded to a second substrate 209.

Step S48: etching a middle portion of a side of the rigid substrate layer facing away from of the second substrate to form a second groove without penetrating the bottom of the first groove, a rigid fence is formed by peripheral walls of the second groove, and a rigid supporting wall is formed between the first groove and the second groove.

A middle portion of a side of the rigid substrate layer 201 facing away from of the second substrate 209 is etched to form a second groove 210 without penetrating the bottom of the first groove 202, a rigid fence 211 is formed by peripheral walls of the second groove 210, and a rigid supporting wall 213 is formed between the first groove 202 and the second groove 210.

Step S49: forming four second notches on the second sub-rigid fence, and forming a first via and a second via on the rigid supporting wall.

Four second notches (not shown in the Figures) are formed on the second sub-rigid fence 211. It can be understand that a position of the second notch can be determined according to a positional relationship between the third wire, the fourth wire and the first wire, the second wire. Details may be referred to the above description of the stretchable panel of the third embodiment. The related description of the first via and the second via can also be referred to the description of the above corresponding embodiment.

Step S50: forming a third wire and a fourth wire extending from outside of the second sub-rigid fence into the second groove through the second notches.

The third wire and the fourth wire 212 are formed on the rigid substrate layer at a bottom of the second groove 210 and outside the second sub-rigid fence 211.

Step S51: etching and removing the rigid substrate layer remaining outside the second sub-rigid fence.

Step S52: forming a second sub-pixel unit in the second groove.

The first electrode 207 of the first sub-pixel unit 206 is connected to the first wire 205, and the second electrode of the first sub-pixel unit 206 is connected to the third wire through the first via; and the first electrode 214 of the second sub-pixel unit 215 is connected to the fourth wire 212, and the second electrode of the second sub-pixel unit 215 is connected to the second wire through the second via. The first wire 205 is parallel to the second wire, and the third wire is parallel to the fourth wire 212. The first wire 205 is perpendicular to the third wire. Details may be referred to the above description of the stretchable display panel of the third embodiment.

Step S53: forming an elastic base layer by casting between the adjacent second sub-rigid fences and over the second sub-pixel unit.

Step S54: peeling off the second substrate.

The method of manufacturing of this embodiment corresponds to the stretchable panel of the third embodiment of the present disclosure, and more details may be referred to the above description.

The present disclosure has the following beneficial effects: in the present disclosure, a pixel unit and a rigid protection body are disposed in at least one of the display units, the rigid protection body includes at least one rigid sidewall disposed on at least one side of the pixel unit; and the rigid sidewall provides protection in a thickness dimension of the pixel unit, and is subjected to a tensile force in a thickness dimension, thereby avoiding damage to the pixel unit due to stretch.

The above is only intended to describe the embodiments of the present disclosure, and thus does not limit the scope of the patent application, and the equivalent structure or equivalent process variation made based on the specification and the drawings of the present disclosure, or directly or indirectly applied in other related technologies, all are included in the protection scope of this application.

The invention claimed is:

1. A stretchable display panel comprising:
   an elastic base layer; and
   a plurality of array-distributed display units embedded in the elastic base layer;
   wherein, at least one of the display units comprises a pixel unit and a rigid protection body, and the rigid protection body comprises at least a rigid sidewall disposed on at least one side of the pixel units.

2. The stretchable display panel according to claim 1, wherein the rigid sidewall is disposed perpendicular to a surface of the elastic base layer.

3. The stretchable display panel according to claim 1, wherein the rigid protection body comprises a plurality of rigid sidewalls disposed at a periphery of the pixel unit, and the plurality of rigid sidewalls is connected to each other to form a rigid fence surrounding the pixel unit.

4. The stretchable display panel according to claim 3, wherein the stretchable display panel further comprises a wire, a notch is provided in the rigid sidewalls, and the wire passes from outside of the rigid fence and is connected to a corresponding pixel unit through the notch.

5. The stretchable display panel according to claim 4, wherein a portion of the wire located outside the rigid fence is embedded into the elastic base layer and is disposed in a stretchable form.

6. The stretchable display panel according to claim 4, wherein the rigid protection body further comprises a rigid supporting wall integrally formed with the rigid sidewalls, the rigid supporting wall being located within the rigid fence, and the pixel unit is at least partially accommodated in a space surrounded by the rigid supporting wall and the rigid sidewalls.

7. The stretchable display panel according to claim 6, wherein the rigid supporting wall is provided with a via hole, and the wire is connected to the pixel unit through the via hole.

8. The stretchable display panel according to claim 6, wherein a portion of the wire located in the rigid fence is disposed on the rigid supporting wall, and a bottom of the notch is disposed flush with a surface of the rigid supporting wall, and the wire remains flat as the wire extends from outside of the rigid fence into the rigid fence through the notch.

9. The stretchable display panel according to claim 6, wherein the wire comprises a first wire and a second wire, the notch is provided in each of the rigid sidewalls of the pixel unit, the pixel units arranged in a row are connected in series with the first wires, and the first wires are connected to first electrodes of the pixel units respectively through the notches on two opposite rigid sidewalls from outside of the rigid fence; the pixel units arranged in a column are connected in series with the second wires, and the second wires are connected to second electrodes of the pixel units respectively through the notches on the other two opposite rigid sidewalls from outside of the rigid fence.

10. The stretchable display panel according to claim 6, wherein the rigid supporting wall is connected to a central portion of the rigid sidewalls to form a first sub-space and a second sub-space divided by the rigid supporting wall, the pixel unit comprises a first sub-pixel unit and a second sub-pixel unit, and the first sub-pixel unit and the second sub-pixel unit are respectively accommodated in the first sub-space and the second sub-space.

11. The stretchable display panel according to claim 10, wherein the rigid fence is provided with a plurality of notches, the wire comprises a first wire, a second wire, a third wire and a fourth wire, and a first via and a second via are disposed in the rigid supporting wall; the first wire and the second wire extend from outside of the rigid fence into the first sub-space through some of the notches, and the third wire and the fourth wire extend from outside of the rigid fence into the second sub-space through other notches; a first electrode of the first sub-pixel unit is connected to the first wire, a second electrode of the first sub-pixel unit is connected to the third wire through the first via, a first electrode of the second sub-pixel unit is connected to the fourth wire, and a second electrode of the second sub-pixel unit is connected to the second wire through the second via; and the first wire is parallel to the second wire, the third wire is parallel to the fourth wire, and the first wire is perpendicular to the third wire.

12. The stretchable display panel according to claim 10, wherein the rigid fence is provided with a plurality of notches, and the wires comprise a first wire, a second wire, a third wire, and a fourth wire; the first wire and the second wire extend from outside of the rigid fence into the first sub-space through some of the notches, and the third wire and the fourth wire extend from outside of the rigid fence into the second sub-space through other notches; a first electrode of the first sub-pixel unit is connected to the first wire, and a second electrode of the first sub-pixel unit is connected to the second wire, a first electrode of the second sub-pixel unit is connected to the third wire, and a second electrode of the second sub-pixel unit is connected to the fourth wire; and the first wire is parallel to the third wire, the second wire is parallel to the fourth wire, and the first wire is perpendicular to the second wire.

13. The stretchable display panel according to claim 10, wherein one of the first sub-pixel unit and the second sub-pixel unit is a light-emitting layer, and the other one of the first sub-pixel unit and the second sub-pixel unit is a driving layer; or the first sub-pixel unit and the second sub-pixel unit are both light emitting layers.

14. A stretchable display panel comprising:
an elastic base layer; and
a plurality of array-distributed display units embedded in the elastic base layer;
wherein, at least one of the display units comprises a pixel unit and a rigid protection body, and the rigid protection body comprises a plurality of rigid sidewalls disposed at a periphery of the pixel unit, and the plurality of rigid sidewalls is connected to each other to form a rigid fence surrounding the pixel unit.

15. The stretchable display panel according to claim 14, wherein the plurality of rigid sidewalls are disposed perpendicular to a surface of the elastic base layer.

16. The stretchable display panel according to claim 14, wherein the stretchable display panel further comprises a wire, a notch is provided in the rigid sidewalls, and the wire passes from outside of the rigid fence and is connected to a corresponding pixel unit through the notch.

17. The stretchable display panel according to claim 16, wherein a portion of the wire located outside the rigid fence is embedded into the elastic base layer and is disposed in a stretchable form.

18. The stretchable display panel according to claim 16, wherein the rigid protection body further comprises a rigid supporting wall integrally formed with the rigid sidewalls, the rigid supporting wall being located within the rigid fence, and the pixel unit is at least partially accommodated in a space surrounded by the rigid supporting wall and the rigid sidewalls.

19. The stretchable display panel according to claim 18, wherein the rigid supporting wall is provided with a via hole, and the wire is connected to the pixel unit through the via hole.

20. The stretchable display panel according to claim 18, wherein a portion of the wire located in the rigid fence is disposed on the rigid supporting wall, and a bottom of the notch is disposed flush with a surface of the rigid supporting wall, and the wire remains flat as the wire extends from outside of the rigid fence into the rigid fence through the notch.

* * * * *